United States Patent
Sonoda et al.

(10) Patent No.: US 9,530,984 B2
(45) Date of Patent: Dec. 27, 2016

(54) ORGANIC ELECTROLUMINESCENCE DISPLAY AND METHOD OF MANUFACTURING THE SAME

(71) Applicant: Sharp Kabushiki Kaisha, Osaka (JP)

(72) Inventors: Tohru Sonoda, Osaka (JP); Takeshi Hirase, Osaka (JP); Tetsuya Okamoto, Osaka (JP); Tohru Senoo, Osaka (JP); Yuki Yasuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/419,647

(22) PCT Filed: Aug. 28, 2013

(86) PCT No.: PCT/JP2013/005072
§ 371 (c)(1),
(2) Date: Feb. 4, 2015

(87) PCT Pub. No.: WO2014/038158
PCT Pub. Date: Mar. 13, 2014

(65) Prior Publication Data
US 2015/0214504 A1 Jul. 30, 2015

(30) Foreign Application Priority Data

Sep. 4, 2012 (JP) ................................ 2012-194372

(51) Int. Cl.
*H01L 29/08* (2006.01)
*H01L 35/24* (2006.01)
(Continued)

(52) U.S. Cl.
CPC ....... *H01L 51/5253* (2013.01); *H01L 51/5256* (2013.01); *H01L 51/56* (2013.01);
(Continued)

(58) Field of Classification Search
CPC .............. H01L 51/5237; H01L 2251/5338; H01L 2924/0002; H01L 51/5253; H01L 2251/5369; H01L 23/562; H01L 2924/12044; H01L 31/0481; H01L 51/0097; H01L 51/5256; H01L 27/3244; H01L 51/56; H05B 33/04; H05B 33/10
(Continued)

(56) References Cited

U.S. PATENT DOCUMENTS

2007/0196682 A1* 8/2007 Visser et al. .................. 428/594
2010/0089636 A1* 4/2010 Ramadas et al. ............. 174/521
(Continued)

FOREIGN PATENT DOCUMENTS

JP 2001-307873 A 11/2001
JP 2002-252080 A 9/2002
(Continued)

OTHER PUBLICATIONS

International Search Report received for PCT Patent Application No. PCT/JP2013/005072 mailed on Dec. 10, 2013, 4 pages.

*Primary Examiner* — Thao X Le
*Assistant Examiner* — Nduka Ojeh
(74) *Attorney, Agent, or Firm* — Morrison & Foerster LLP

(57) ABSTRACT

A barrier film configured to reduce degradation of an organic EL element includes a first inorganic film, a second inorganic film, and a third inorganic film which are provided in order from a base substrate, a first organic film between the first inorganic film and the second inorganic film, and a second organic film between the second inorganic film and the third inorganic film. The first organic film has a plurality of first through holes formed therein so that the first inorganic film is in contact with the second inorganic film through the first through holes. The second organic film has (Continued)

a plurality of second through holes formed therein so that the second inorganic film is in contact with the third inorganic film through the second through holes.

15 Claims, 9 Drawing Sheets

(51) Int. Cl.
  *H01L 51/00* (2006.01)
  *H01L 51/52* (2006.01)
  *H05B 33/04* (2006.01)
  *H05B 33/10* (2006.01)
  *H01L 51/56* (2006.01)
  *H01L 27/32* (2006.01)

(52) U.S. Cl.
  CPC .............. *H05B 33/04* (2013.01); *H05B 33/10* (2013.01); *H01L 27/3244* (2013.01)

(58) Field of Classification Search
  USPC .............. 257/40, E21.102, E23.194, E33.04, 257/E33.055, E33.059, E51.001, 88, 98; 438/26, 28, 57, 66, 80
  See application file for complete search history.

(56) References Cited

U.S. PATENT DOCUMENTS

| 2010/0151209 A1* | 6/2010 | Wei et al. ..................... 428/189 |
| 2012/0100647 A1* | 4/2012 | Kim et al. ..................... 438/28 |
| 2012/0256202 A1* | 10/2012 | Lee ..................... H01L 51/5256 257/88 |

FOREIGN PATENT DOCUMENTS

| JP | 2003-017244 A | 1/2003 |
| JP | 2003-282239 A | 10/2003 |

\* cited by examiner

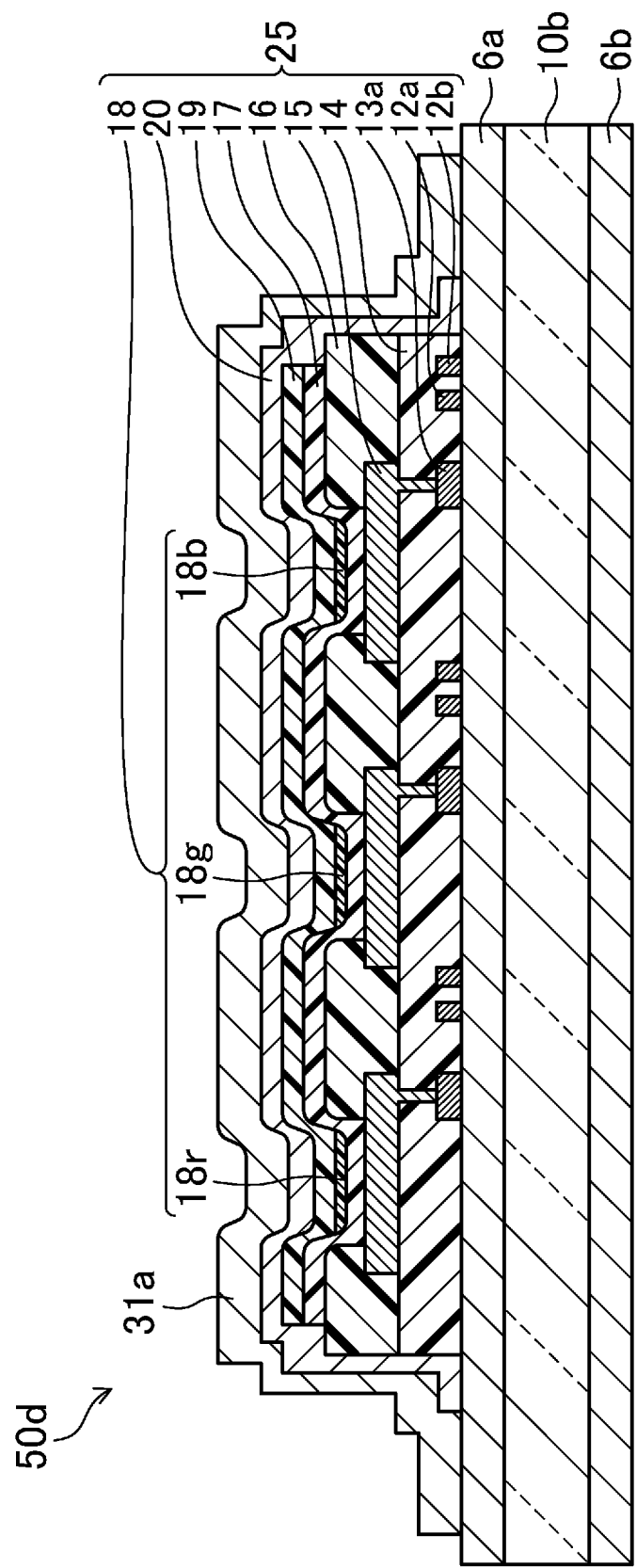

ORGANIC ELECTROLUMINESCENCE DISPLAY AND METHOD OF MANUFACTURING THE SAME

CROSS REFERENCE TO RELATED APPLICATIONS

This is a U.S. National Phase patent application of PCT/JP2013/005072, filed Aug. 28, 2013, which claims priority to Japanese Patent Application No. 2012-194372, filed Sep. 4, 2012, each of which is hereby incorporated by reference in the present disclosure in its entirety.

TECHNICAL FIELD

The present invention relates to organic electroluminescence displays and methods of manufacturing the same, and more particularly relates to organic electroluminescence displays including a barrier film obtained by stacking an inorganic film and an organic film and a method of manufacturing the same.

BACKGROUND ART

For organic electroluminescence (hereinafter also referred to as "EL") displays including organic EL elements, a structure has been proposed in order to reduce degradation of the organic EL elements. In the structure, a barrier film obtained by stacking an inorganic film and an organic film is provided to cover the organic EL elements, or in the case of using a plastic substrate, to cover a surface of the plastic substrate, thereby reducing entry of moisture and oxygen.

For example, Patent Document 1 describes an organic EL display element including a sealing layer which corresponds to the above-described barrier film and includes a first barrier layer obtained by sequentially vacuum depositing a $SiO_2$ film and an Al film on a counter electrode (cathode) which is a component of the above-described organic EL element, a resin layer obtained by vacuum depositing polyethylene glycol acrylate on the first barrier layer and hardening the deposited polyethylene glycol acrylate, and a second barrier layer obtained by sequentially vacuum depositing an Al film and a $SiO_2$ film on the resin layer.

Patent Document 2 describes an electric field light emitting element including a multilayer film as the above-described barrier film, wherein the multilayer film includes a polymer material layer and an inorganic material thin film and is provided on a cathode film which is a component of the above-described organic EL element.

Patent Document 3 describes an organic electric field light emitting element including a barrier layer as the above-described barrier film, wherein the barrier layer is obtained by alternately stacking organic layers and inorganic layers on an element corresponding to the above-described organic EL element.

CITATION LIST

Patent Document

Patent Document 1: Japanese Unexamined Patent Publication No. 2001-307873
Patent Document 2: Japanese Unexamined Patent Publication No. 2002-252080
Patent Document 3: Japanese Unexamined Patent Publication No. 2003-17244
Patent Document 4: Japanese Unexamined Patent Publication No. 2003-282239

SUMMARY OF THE INVENTION

Technical Problem

Due to low adhesiveness between an inorganic film and an organic film included in the barrier film, delamination may occur at the interface between the inorganic film and the organic film of the barrier film. If the delamination occurs at the interface between the inorganic film and the organic film, entrance of moisture or oxygen through the interface is allowed, which leads to degradation of the organic EL element. In the case of an organic EL display including a flexible plastic substrate (film substrate) as a base substrate, bending stress occurs at the interface between the inorganic film and the organic film due to a bend of the substrate, so that delamination is likely to occur at the interface between the inorganic film and the organic film. Moreover, due to the difference between the thermal expansion coefficients of the inorganic film and the organic film, thermal stress occurs at the interface between the inorganic film and the organic film when temperature changes, so that delamination is likely to occur at the interface between the inorganic film and the organic film.

To address the above-described problems, Patent Document 4 proposes an organic EL display panel including a clathrate inorganic barrier layer as the above-described barrier film. The clathrate inorganic barrier layer includes a first inorganic barrier layer, a first group of dots of a polymer compound layer, an intermediate second inorganic barrier layer, a second group of dots of a polymer compound layer, an intermediate third inorganic barrier layer, a third group of dots of a polymer compound layer, and a fourth inorganic barrier layer at an outermost surface which are sequentially stacked on a resin substrate.

In the organic EL display panel described in Patent Document 4, since each of organic films which are the polymer compound layers is patterned into islands, the inorganic films in pairs and sandwiching a corresponding one of the organic films are in contact with each other. This reduces delamination at the interface between the inorganic film and the organic film at a certain degree. However, when thermal stress or bending stress occurs at the interface between the inorganic film and the organic film as described above, the stress is applied to the individual dots (islands) of the organic film, so that distributing and relieving the stress become difficult, which may cause delamination at the interface between the inorganic film and the organic film. Therefore, the organic EL display panel described in Patent Document 4 is still susceptible to improvement.

In view of the foregoing, it is an object of the present invention to reduce delamination which occurs at the interface between an inorganic film and an organic film included in a barrier film due to stress caused at the interface.

Solution to the Problem

To achieve the object, the present invention includes a barrier film formed by sequentially stacking a first inorganic film, a first organic film having a plurality of first through holes formed therein, a second inorganic film, a second organic film having a plurality of second through holes formed therein, and a third inorganic film.

Specifically, an organic electroluminescence display according to an aspect of the present invention includes: a base substrate; an organic electroluminescence element (directly or indirectly) provided on the base substrate; a barrier film configured to reduce degradation of the organic electroluminescence element, wherein the barrier film includes a first inorganic film, a second inorganic film, and a third inorganic film in order from the base substrate, a first organic film between the first inorganic film and the second inorganic film, and a second organic film between the second inorganic film and the third inorganic film, the first organic film has a plurality of first through holes formed therein such that the first inorganic film is in contact with the second inorganic film through the first through holes, and the second organic film has a plurality of second through holes formed therein such that the second inorganic film is in contact with the third inorganic film through the second through holes.

The first through holes and the second through holes may be provided so as not to overlap each other.

Each of the first through holes and the second through holes may have a linear shape.

Each of the first through holes and the second through holes may be dot-shaped.

The first organic film having the first through holes formed in a dot-pattern and the second organic film having the second through holes formed in a dot-pattern have a structure in which in the dot-shaped polymer compound layer described in Patent Document 4, the region provided with the polymer compound layer and the region provided with no polymer compound layer are exactly reversed.

The barrier film may be a sealing film covering the organic electroluminescence element.

The barrier film may be a base coat film on a surface of the base substrate facing the organic electroluminescence element.

The barrier film may be a protection film on a surface of the base substrate opposite to the organic electroluminescence element.

An organic electroluminescence display according to another aspect of the present invention includes: a base substrate; an organic electroluminescence element (directly or indirectly) provided on the base substrate; and a barrier film configured to reduce degradation of the organic electroluminescence element, wherein the barrier film includes first to nth inorganic films in order from the base substrate, where n is a natural number greater than or equal to 3, and first to (n−1)th organic films each provided between adjacent ones of the inorganic films in order from the base substrate, each of the first to (n−1)th organic films has a plurality of through holes formed therein such that the inorganic films adjacent to the organic film are in contact with each other through the through holes, and at least one of the first to (n−1)th organic films overlaps the through holes formed in at least one of the organic films other than the at least one organic film when viewed in plan.

A method of manufacturing an organic electroluminescence display according to an aspect of the present invention includes: an EL element formation step of forming an organic electroluminescence element (directly or indirectly) on a base substrate; and a barrier film formation step of forming a barrier film configured to reduce degradation of the organic electroluminescence element, wherein at the barrier film formation step, a first inorganic film, a first organic film having a plurality of first through holes formed in a thickness direction thereof and passing therethrough, a second inorganic film, a second organic film having a plurality of second through holes formed in a thickness direction thereof and passing therethrough, and a third inorganic film are sequentially formed.

At the barrier film formation step, the first organic film and the second organic film may be formed such that the first through holes and the second through holes do not overlap each other.

At the barrier film formation step, the first organic film and the second organic film may be formed by vacuum coating.

At the barrier film formation step, the first organic film and the second organic film may be formed by a printing method or photolithography.

The barrier film formation step may be performed after the EL element formation step, and at the barrier film formation step, a sealing film covering the organic electroluminescence element may be formed as the barrier film.

The barrier film formation step may be performed before the EL element formation step, and at the barrier film formation step, a base coat film covering a surface of the base substrate facing the organic electroluminescence element may be formed as the barrier film.

The barrier film formation step may be performed before the EL element formation step, and at the barrier film formation step, a protection film covering a surface of the base substrate opposite to the organic electroluminescence element may be formed as the barrier film.

Advantages Of The Invention

According to the present invention, a first inorganic film, a first organic film having a plurality of first through holes formed therein, a second inorganic film, a second organic film having a plurality of second through holes formed therein, and a third inorganic film are sequentially formed, thereby forming a barrier film. Thus, it is possible to reduce delamination at the interface between the inorganic film and the organic film included in the barrier film due to stress at the interface between the inorganic film and the organic film.

BRIEF DESCRIPTION OF THE DRAWINGS

FIG. 14 is a cross-sectional view illustrating an organic EL display according to a fourth embodiment.

DESCRIPTION OF EMBODIMENTS

Embodiments of the present disclosure will be described in detail below based on the drawings. The present invention is not limited to the following embodiments.

<<First Embodiment of Invention>>

Figure 1:
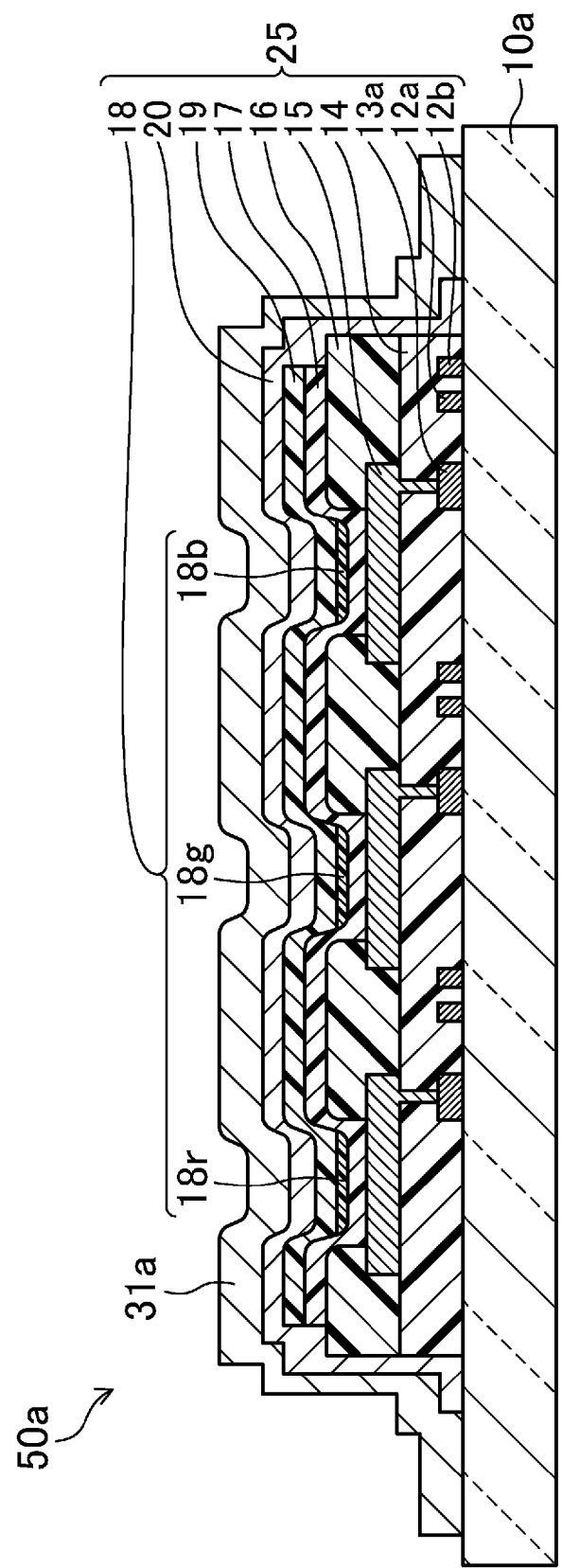
FIG. 1 is a cross-sectional view of an organic EL display according to a first embodiment.
Figure 2:
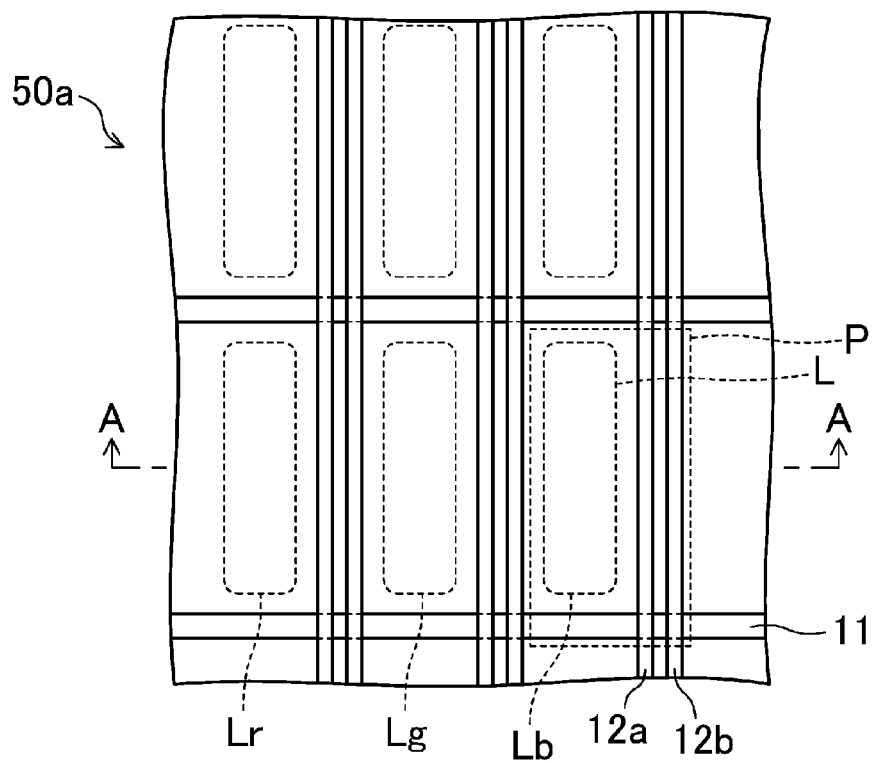
FIG. 2 is a plan view illustrating a pixel structure of the organic EL display according to the first embodiment.
Figure 3:
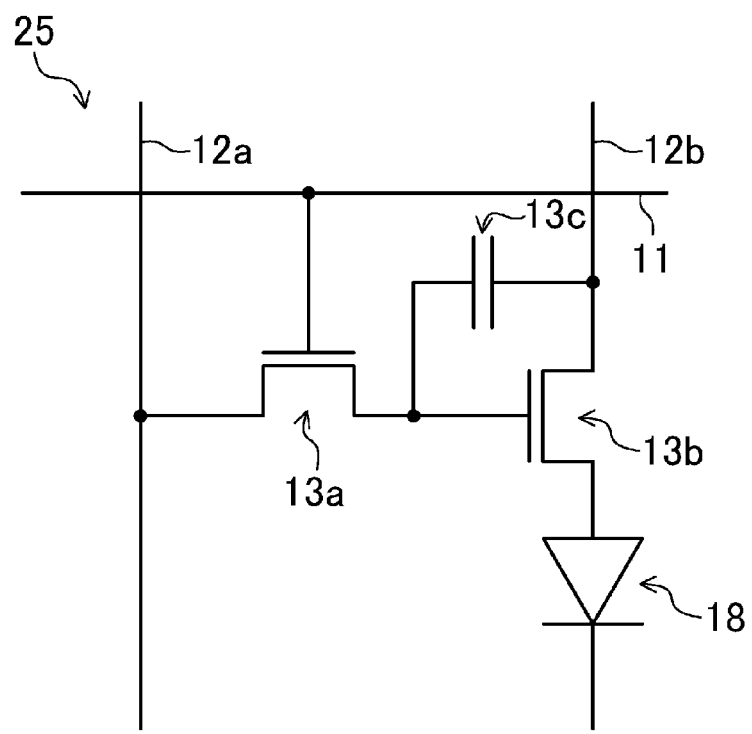
FIG. 3 is an equivalent circuit diagram of an organic EL element included in the organic EL display according to the first embodiment.
Figure 4:
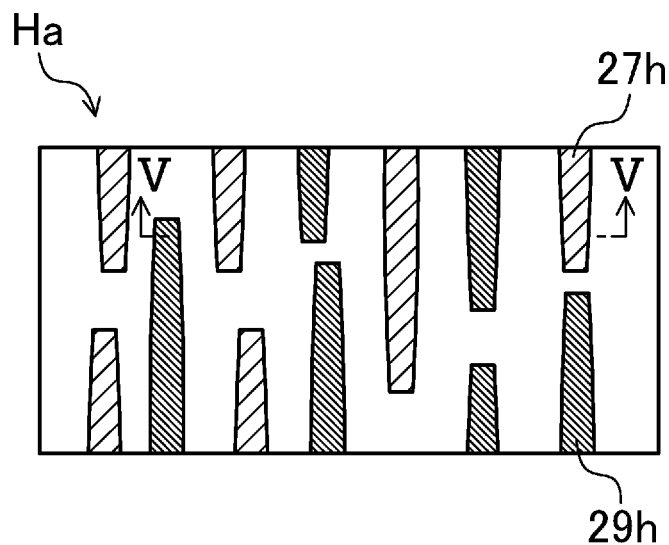
FIG. 4 is a plan view illustrating a structure of through holes in a barrier film included in the organic EL display according to the first embodiment.
Figure 5:
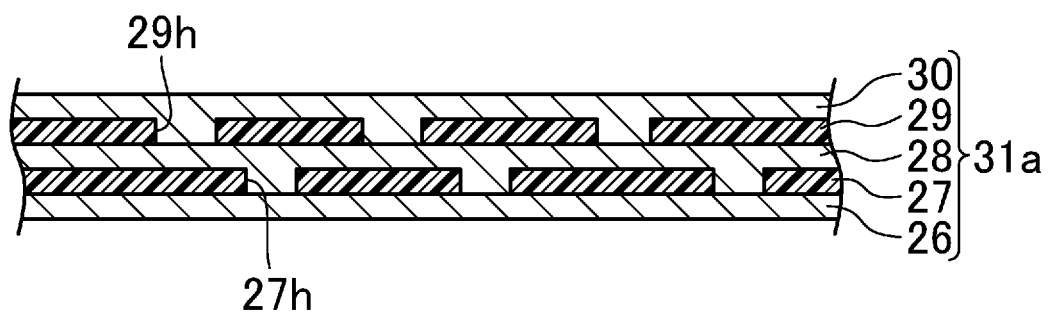
FIG. 5 is a cross-sectional view illustrating the barrier film taken along the line V-V of FIG. 4.

FIGS. 1-10 illustrate a first embodiment of an organic EL display according to the present invention and a method of manufacturing the same. FIG. 1 is a cross-sectional view illustrating an organic EL display 50a of the present embodiment. FIG. 2 is a plan view illustrating a pixel structure of the organic EL display 50a. Note that FIG. 1 is the cross-sectional view taken along the line A-A of FIG. 2. FIG. 3 is an equivalent circuit diagram of an organic EL element 25 included in the organic EL display 50a. FIG. 4 is a plan view illustrating a structure Ha of through holes in a sealing film 31a included in the organic EL display 50a. FIG. 5 is a cross-sectional view illustrating the sealing film 31a taken along the line V-V of FIG. 4.

As illustrated in FIG. 1, the organic EL display 50a includes a base substrate 10a such as a glass substrate, the organic EL element 25 on the base substrate 10a, and the sealing film 31a as a barrier film. The sealing film 31a covers the organic EL element 25 so as to reduce degradation of the organic EL element 25. A plurality of sub-pixels P (see FIG. 2) each of which is a minimum unit of an image are arranged in a display region (not shown) of the organic EL display 50a in a matrix pattern. As illustrated in FIG. 2, sub-pixels P having light emission regions Lr for displaying gradation of a red color, sub-pixels P having light emission regions Lg for displaying gradation of a green color, and sub-pixels P having light emission regions Lb for displaying gradation of a blue color are placed next to one another in the display region of the organic EL display 50a, and three of the sub-pixels P placed next to one another form a pixel.

As illustrated in FIGS. 1-3, the organic EL element 25 includes: a plurality of gate lines 11 extending parallel to each other on the base substrate 10a; a plurality of source lines 12a extending parallel to each other in a direction orthogonal to the gate lines 11; a plurality of power supply lines 12b which extend parallel to each other in a direction orthogonal to the gate lines 11 and each of which is adjacent to a corresponding one of the source lines 12a; a plurality of first TFTs 13a each provided at a corresponding one of intersections of the gate lines 11 and the source lines 12a, that is, each provided for a corresponding one of the sub-pixels P, and connected to the gate line 11 and the source line 12a of the corresponding intersection; a plurality of second TFTs 13b each provided for a corresponding one of the sub-pixels P and connected to the first TFT 13a of the corresponding sub-pixel P and a corresponding one of the power supply lines 12b; a plurality of capacitors 13c each provided for a corresponding one of the sub-pixels P and connected to the first TFT 13a of the corresponding sub-pixel P and a corresponding one of the power supply lines 12b; an interlayer insulating film 14 covering the first TFTs 13a, the second TFTs 13b, and the capacitors 13c; a plurality of first electrodes 15 each provided on the interlayer insulating film 14 as an anode for a corresponding one of the sub-pixels P, and connected the first TFT 13a and the second TFTs 13b of the corresponding sub-pixel P; an edge cover 16 in a form of a grid covering edges of the first electrodes 15; successively formed hole injection and transport layers 17 covering the first electrodes 15 and the edge cover 16; a plurality of light-emitting layers 18 on the hole injection and transport layers 17 each provided for a corresponding one of the sub-pixels P; a successively formed electron transport and injection layer 19 covering the light-emitting layers 18; and a second electrode 20 as a cathode covering the electron transport and injection layer 19. Here, a carrier blocking layer for blocking flow of carriers such as positive holes and electrons may be inserted between each of the first electrodes 15 and the second electrode 20 as necessary. The hole injection and transport layers 17 and the electron transport and injection layer 19 may be accordingly omitted.

The first TFTs 13a and the second TFTs 13b are, for example, bottom gate type or top gate type TFTs.

Each capacitor 13c includes, for example, one electrode made of the same material and formed in the same layer as the gate line 11, the other electrode made of the same material and formed in the same layer as the source line 12a, and a gate insulating film between the electrodes in pairs.

The interlayer insulating film 14 and the edge cover 16 are made of, for example, a photosensitive acrylic resin, a photosensitive polyimide resin, etc.

The first electrodes 15 and the second electrode 20 are made of, for example, a transparent conductive film of indium tin oxide (ITO), indium zinc oxide (IZO), gallium-added zinc oxide (GZO), etc., a metal film of gold (Au), nickel (Ni), platinum (Pt), etc., or a multilayer film of these films. The first electrodes 15 and the second electrode 20 are suitably formed by, for example, a sputtering method, vacuum deposition, CVD, plasma CVD, a printing method, etc. When the first electrodes 15 have a light transmissive or semi-transmissive characteristic, and second electrode 20 has a light reflective characteristic, a bottom emission type display is formed, where light is output from the base substrate 10a. When the first electrodes 15 have a light reflective characteristic, and the second electrode 20 has a light transmissive or semi-transmissive characteristic, a top emission type display is formed, where light is output from the sealing film 31a.

The hole injection and transport layers 17 have the function of increasing the efficiency of injecting holes from the first electrodes 15 to the light-emitting layers 18 and the function of increasing the efficiency of transporting holes to the light-emitting layers 18. The hole injection and transport layers 17 are made of, for example, a chain or heterocyclic conjugated system monomer, oligomer, or polymer such as anthracene, azatriphenylene, fluorenone, hydrazone, stilbene, triphenylene, benzine, styrylamine, triphenylamine, porphyrin, triazole, imidazole, oxadiazole, oxazole, polyaryl alkane, phenylene diamine, arylamine, a derivative thereof, a thiophene-based compound, a polysilane-based compound, a vinylcarbazole-based compound, an aniline-based compound, etc. The hole injection and transport layers 17 may be formed as a single layer having both the function of increasing the efficiency of injecting holes and the function of increasing the efficiency of transporting holes as described above, or may be formed as a multilayer film including a single layer having the function of increasing the efficiency of injecting holes and a single layer having the function of increasing the efficiency of transporting holes.

The hole injection and transport layers 17 are suitably formed by, for example, vacuum deposition.

Each of the plurality of light-emitting layers 18 has the function of recombining positive holes injected from the first electrode 15 and electrons injected from the second electrode 20 to output light. The light-emitting layer 18 includes, for example, a light-emitting layer 18r provided in the light emission region Lr for displaying gradation of a red color, a light-emitting layer 18g provided in the light emission region Lg for displaying gradation of a green color, and a light-emitting layer 18b provided in the light emission region Lb for displaying gradation of a blue color. The light-emitting layers 18 are made of a material having high luminance efficiency such as a low-molecular fluorescent dye and a metal complex examples of which include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, a derivative thereof, a tris(8-quinolinolato) aluminum complex, a bis(benzoquinolinolato)beryllium complex, a tri(dibenzoyl methyl) phenanthroline europium complex, ditoluylvinylbiphenyl, hydroxyphenyl oxazole, and hydroxyphenyl thiazole. The light-emitting layers 18 are suitably formed by, for example, vacuum deposition, etc.

The electron transport and injection layer 19 has the function of increasing the efficiency of transporting electrons to the light-emitting layers 18, and the function of increasing the efficiency of injecting electrons from the second electrodes 15 to the light-emitting layers 18. The electron transport and injection layer 19 is made of, for example, a tris(8-quinolinolato) aluminum complex, an oxadiazole derivative, a triazole derivative, a phenylquinoxaline derivative, a silole derivative, etc. As described above, the electron transport and injection layer 19 may be formed as a single layer having both the function of increasing the efficiency of transporting electrons and the function of increasing the efficiency of injecting electrons or may be formed as a multilayer film including a single layer having the function of increasing the efficiency of transporting electrons and a single layer having the function of increasing the efficiency of injecting electrons. The electron transport and injection layer 19 is suitably formed by, for example, vacuum deposition, etc.

As illustrated in FIG. 5, the sealing film 31a includes a first inorganic film 26, a first organic film 27, a second inorganic film 28, a second organic film 29, and a third inorganic film 30 provided in order from the base substrate 10a.

As illustrated in FIG. 5, the first organic film 27 has a plurality of first line-shaped through holes 27h formed therein so that the first inorganic film 26 is in contact with the second inorganic film 28.

As illustrated in FIG. 5, the second organic film 29 has a plurality of second line-shaped through holes 29h formed therein so that the second inorganic film 28 is in contact with the third inorganic film 30.

As illustrated in FIG. 4, the first organic films 27 and the second organic films 29 have the through hole structure Ha in which the second through holes 29h each do not overlap the first through hole 27h. The first organic film 27 having the first line-shaped through holes 27h formed therein and the second organic film 29 having the second line-shaped through holes 29h formed therein are suitably formed by, for example, vacuum coating such as CVD, vapor deposition, sputtering, etc.

FIGS. 6-9 are plan views illustrating structures Hb-He of through holes of first to fourth variations of the sealing film 31a.

Figure 6:
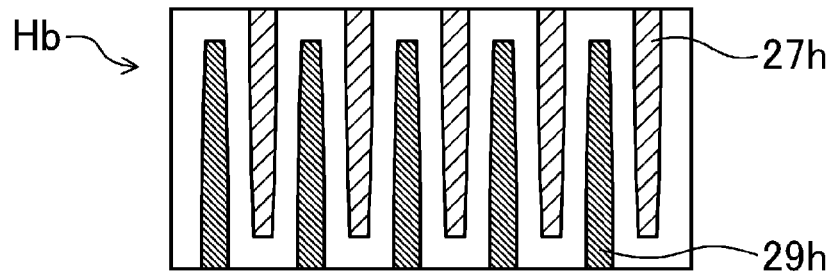
FIG. 6 is a plan view illustrating a structure of through holes of a first variation of the barrier film according to the first embodiment.

In the through hole structure Hb of the first variation, as illustrated in FIG. 6, first line-shaped through holes 27h and second line-shaped through holes 29h are alternately arranged to extend in a vertical direction in the figure. At first organic film 27 having the first line-shaped through holes 27h formed therein and a second organic film 29 having the second line-shaped through holes 29h formed therein are suitably formed by, for example, vacuum coating such as CVD, vapor deposition, sputtering, etc.

Figure 7:
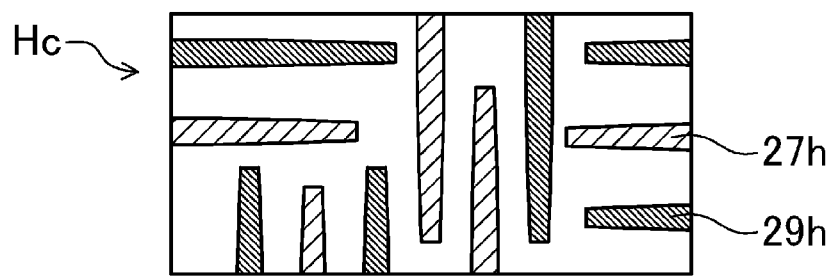
FIG. 7 is a plan view illustrating a structure of through holes of a second variation of the barrier film according to the first embodiment.

In the through hole structure Hc of the second variation, as illustrated in FIG. 7, first line-shaped through holes 27h and second line-shaped through holes 29h are randomly arranged to extend in a vertical direction and a lateral direction in the figure. A first organic film 27 having the first line-shaped through holes 27h formed therein and a second organic film 29 having the second line-shaped through holes 29h formed therein are suitably formed, for example, vacuum coating such as CVD, vapor deposition, sputtering, etc.

Figure 8:
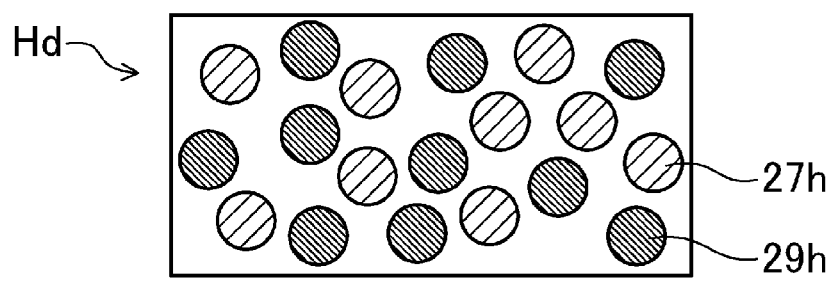
FIG. 8 is a plan view illustrating a structure of through holes of a third variation of the barrier film according to the first embodiment.

In the through hole structure Hd of the third variation, as illustrated in FIG. 8, first dot-shaped through holes 27h and second dot-shaped through holes 29h are randomly provided. A first organic film 27 having the first dot-shaped through holes 27h formed therein and a second organic film 29 having the second dot-shaped through holes 29h formed therein are suitably formed by a printing method or photolithography.

Figure 9:
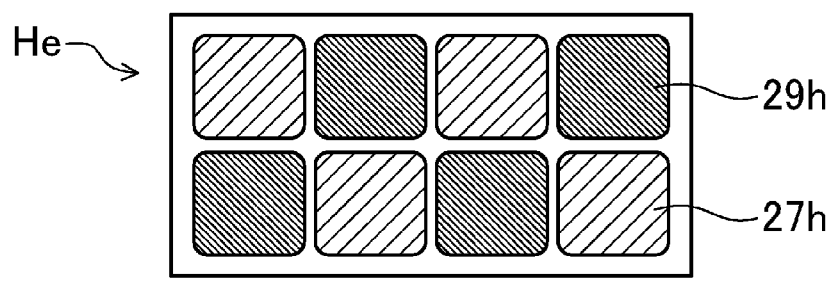
FIG. 9 is a plan view illustrating a structure of through holes of a fourth variation of the barrier film according to the first embodiment.

In the through hole structure He of the fourth variation, as illustrated in FIG. 9, first rectangular through holes 27h and second rectangular through holes 29h are alternately arranged. A first organic film 27 having the first rectangular through holes 27h formed therein and a second organic film 29 having the second rectangular through holes 29h formed therein are suitably formed by a printing method or photolithography.

Figure 10:
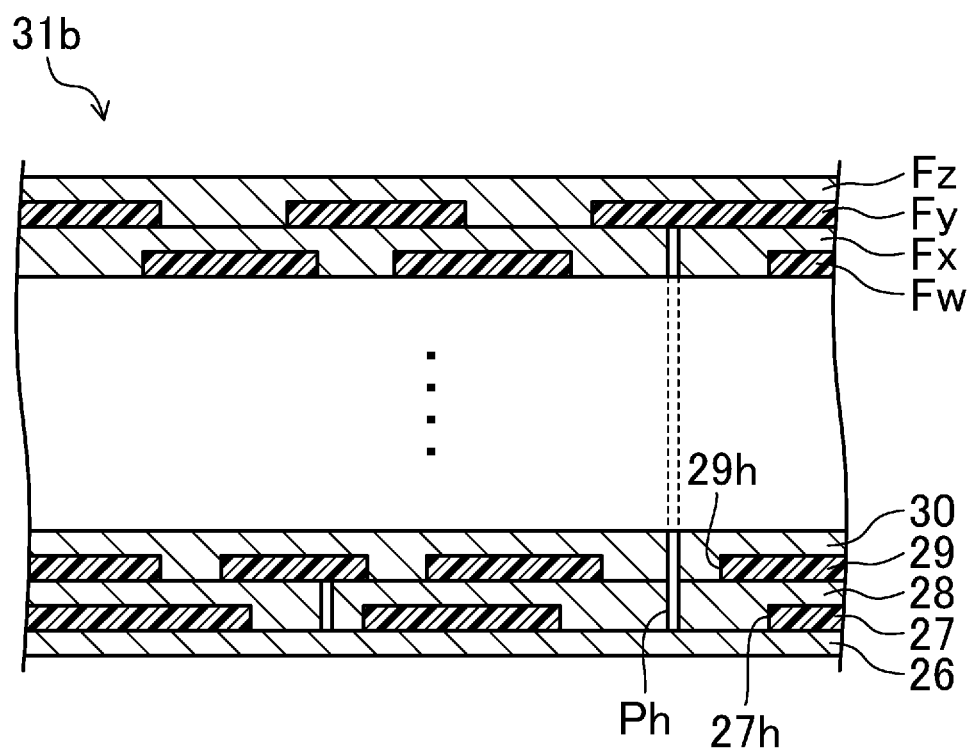
FIG. 10 is a cross-sectional view illustrating a structure of through holes of a fifth variation of the barrier film according to the first embodiment.

FIG. 10 is a cross-sectional view illustrating a sealing film 31b of a fifth variation of the sealing film 31a. The through hole structures Ha-He, in which the second through holes 29h each do not overlap the first through hole 27h, have been described in the present embodiment and in the first to fourth variations. However, when the sealing film has three or more independent organic films, second through holes 29h each may overlap a first through hole 27h as in the case of a sealing film 31b described below.

Specifically, as illustrated in FIG. 10, the sealing film 31b includes a first inorganic film 26, a first organic film 27, a second inorganic film 28, a second organic film 29, a third inorganic film 30, . . . , an (n−2)th organic film Fw (where n is an integer greater than or equal to 5), an (n−1)th inorganic film Fx, an (n−1)th organic film Fy, and an nth inorganic film Fz in order from a base substrate 10a. As illustrated in FIG. 10, in the sealing film 31b, through holes in the first organic film 27, in the second organic film 29, . . . , and in the (n−2)th organic film Fw overlap one another. Therefore, a pin hole Ph formed in the second inorganic film 28 extends to the inorganic films above the second inorganic film 28 in the figure, whereas no pin hole (Ph) is formed in the nth inorganic film Fz because the pin hole Ph is covered with the (n−1)th organic film Fy. The present variation has described a configuration in which the through holes in the first organic film 27, the second organic film 29, . . . , and the (n−2)th organic film Fw overlap one another, and thorough holes in the (n−1)th organic film Fy do not overlap the through holes, which overlap one another, that is, a configuration in which at least one of the first to (n−1)th organic films overlaps through holes formed in at least one of the other organic films except the one organic film when viewed in plan, so that the pin hole (Ph) formed in the inorganic film is necessarily covered with any one of the organic films. However, a configuration in which through holes in the first to (n−1)th organic films do not overlap one another is of course more preferable.

The organic EL display 50a having the above-described configuration is configured such that in each sub-pixel P, a gate signal is input to the first TFT 13a via the gate line 11 to turn on the first TFT 13a, a predetermined voltage corresponding to a source signal is applied to a gate electrode of the second TFT 13b and the capacitor 13c via the source line 12a, the magnitude of a current from the power supply line 12b is determined based on a gate voltage of the second TFT 13b, and the determined current is supplied to the light-emitting layer 18, so that the light-emitting layer 18 emits light, thereby displaying an image. In the organic EL display 50a, even when the first TFT 13a is off, the gate voltage of second TFT 13b is retained by the capacitor 13c, so that the light-emitting layer 18 continues emitting light until a gate signal in a next frame is input.

Next, a method of manufacturing the organic EL display 50a of the present embodiment will be described. The method of manufacturing the organic EL display 50a of the present embodiment includes an EL element formation step and a sealing film formation step.

<EL Element Formation Step>

On a surface of a base substrate 10a such as a glass substrate, gate lines 11, source lines 12a, power supply lines 12b, first TFTs 13a, second TFTs 13b, capacitors 13c, an interlayer insulating film 14, first electrodes 15, an edge cover 16, hole injection and transport layers 17, light-emitting layers 18, an electron transport and injection layer 19, a second electrode 20, etc. are formed by using a known method, thereby forming an organic EL element 25.

<Sealing Film Formation Step (Barrier Film Formation Step)>

On a surface of the organic EL element 25 (the second electrode 20) formed at the EL element formation step, a thin film made of silicon nitride, silicon oxide, silicon oxynitride, aluminum oxide, etc. is formed to have a thickness of about 100 nm by, for example, vapor deposition, thereby forming a first inorganic film 26.

Subsequently, a thin film made of polyacrylate, polyurea, parylene (polyparaxylylene), polyimide, polyamide, or the like is formed to have a thickness of about thickness 3 μm on a surface of the first inorganic film 26 by, for example, vapor deposition using a vapor deposition mask, thereby forming a first organic film 27 having first through holes 27h formed therein.

Then, a thin film made of silicon nitride, silicon oxide, silicon oxynitride, aluminum oxide, or the like is formed to have a thickness of about 100 nm on a surface of the first organic film 27 by, for example, vapor deposition, thereby forming a second inorganic film 28.

Further, a thin film made of polyacrylate, polyurea, parylene, polyimide, polyamide, or the like is formed to have a thickness of about 3 μm on a surface of the second inorganic film 28 by, for example, vapor deposition using a vapor deposition mask, thereby forming a second organic film 29 having second through holes 29h formed therein.

Finally, a thin film made of silicon nitride, silicon oxide, silicon oxynitride, aluminum oxide, or the like is formed to have a thickness of about 100 nm on a surface of the second organic film 29 by, for example, vapor deposition, thereby forming a third inorganic film 30. Thus, a sealing film 31a is formed.

In the manner described above, an organic EL display 50a of the present embodiment can be manufactured.

As described above, according to the organic EL display 50a of the present embodiment and the method of manufacturing the same, the sealing film 31a for reducing degradation of the organic EL element 25 formed on the base substrate 10a at the EL element formation step is formed at the sealing film formation step by sequentially forming the first inorganic film 26, the first organic film 27 having the plurality of first through holes 27h formed in a thickness direction thereof, the second inorganic film 28, the second organic film 29 having the plurality of second through holes 29h formed in a thickness direction thereof, and the third inorganic film 30. Thus, each of the first organic film 27 and the second organic film 29 is a continuous film. Therefore, stress caused at interfaces between the first inorganic film 26, the first organic film 27, the second inorganic film 28, the second organic film 29, and the third inorganic film 30 of the multilayer film can be distributed and relieved by each of the entire first organic film 27 and the entire second organic film 29. Delamination at the interfaces between the first inorganic film 26, the first organic film 27, the second inorganic film 28, the second organic film 29, and the third inorganic film 30 of the multilayer film can be reduced. Therefore, it is possible to reduce delamination at the interface between an inorganic film and an organic film included in the sealing film 31a due to stress caused at the interface between the inorganic film and the organic film.

Moreover, according to the method of manufacturing the organic EL display 50a of the present embodiment, the first organic film 27 and the second organic film 29 are formed by vacuum coating. In this case, the aperture ratio of a film forming mask (vapor deposition mask) for shielding film forming particles is higher than in the case where the organic film is patterned into dots (islands). Thus, it is possible to limit a reduction in film formation rates of the first organic film 27 and the second organic film 29 to a lesser degree.

According to the organic EL display 50a of the present embodiment and the method of manufacturing the same, at the sealing film formation step, the first organic film 27 and the second organic film 29 are formed such that the first through holes 27h and the second through holes 29h do not overlap with each other. Therefore, even when a pin hole or cracks are formed in the first inorganic film 26 or the second inorganic film 28, the pin hole or the cracks are covered with the first organic film 27 or the second organic film 29, so that it is possible to reduce degradation in barrier characteristics of the sealing film 31a.

<<Second Embodiment of Invention>>

Figure 11:
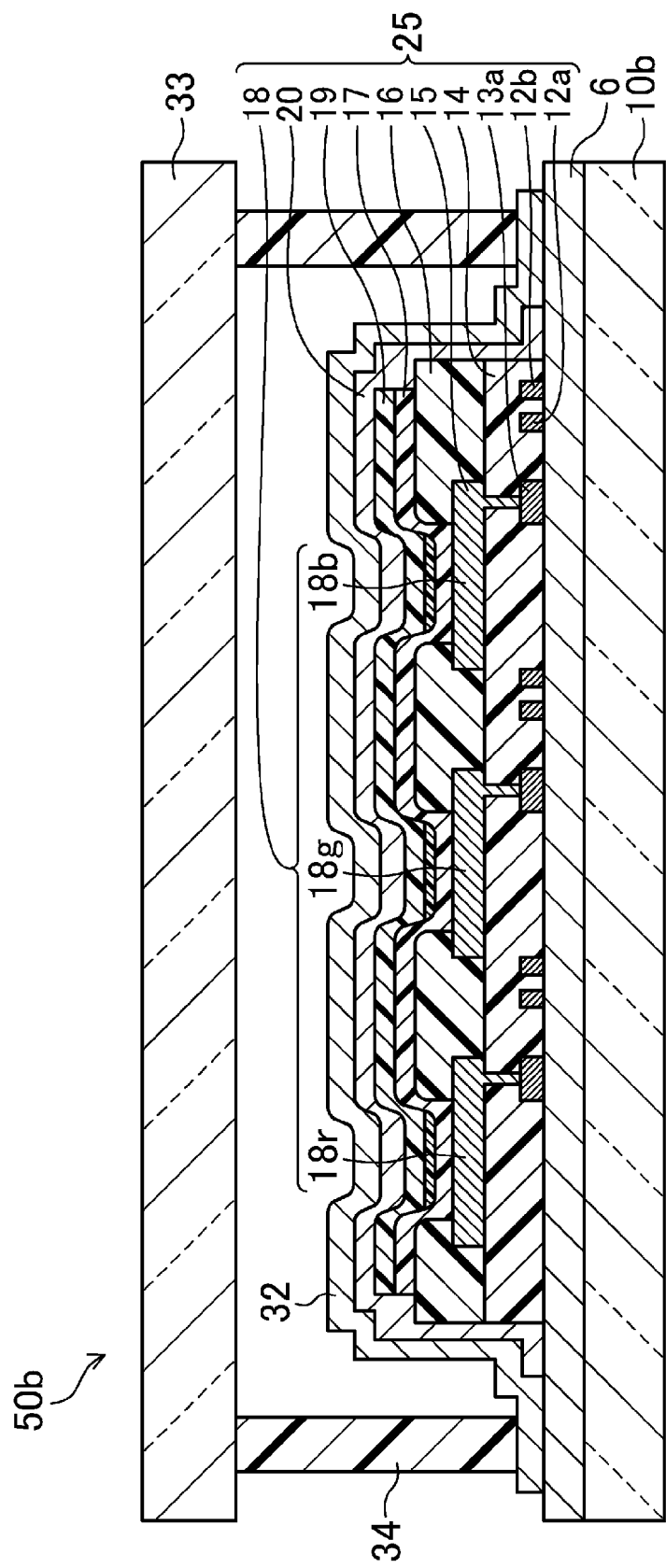
FIG. 11 is a cross-sectional view illustrating an organic EL display according to a second embodiment.
Figure 12:
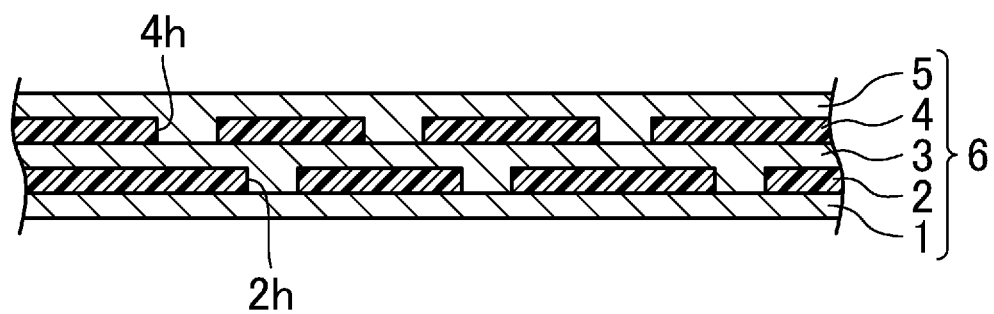
FIG. 12 is a cross-sectional view illustrating a barrier film included in the organic EL display according to the second embodiment.

FIG. 11 is a cross-sectional view of an organic EL display 50b of the present embodiment. FIG. 12 is a cross-sectional view of a base coat film 6 included in the organic EL display 50b. In the following embodiments, the same reference numerals as those shown in FIGS. 1-10 are used to represent equivalent elements, and the detailed explanation thereof will be omitted.

In the first embodiment, the organic EL display 50a including the sealing film 31a (31b) as a barrier film has been described. In the present embodiment, the organic EL display 50b including the base coat film 6 as a barrier film will be described.

As illustrated in FIG. 11, the organic EL display 50b includes a base substrate 10b such as a plastic substrate, the base coat film 6 as a barrier film provided on the base substrate 10b to reduce degradation of an organic EL element 25, the organic EL element 25 on the base coat film 6, a sealing film 32 covering the organic EL element 25, a sealing substrate 33 facing the base substrate 10b, and a frame-shaped sealing resin 34 with which the base substrate 10b and the sealing substrate 33 are bonded together.

As illustrated in FIG. 12, the base coat film 6 includes a first inorganic film 1, a first organic film 2, a second inorganic film 3, a second organic film 4, and a third inorganic film 5 provided in order from the base substrate 10b.

As illustrated in FIG. 12, the first organic film 2 has a plurality of first line-shaped through holes 2h formed therein so that the first inorganic film 1 and the second inorganic film 3 are in contact with each other.

As illustrated in FIG. 12, the second organic film 4 has a plurality of second line-shaped through holes 4h formed therein so that the second inorganic film 3 and the third inorganic film 5 are in contact with each other.

As illustrated in FIG. 12, the first organic film 2 and the second organic film 4 are provided such that each of the second through holes 4h does not overlap a corresponding one of the first through holes 2h. The first organic film 2 having the first line-shaped through holes 2h formed therein and the second organic film 4 having the second line-shaped through holes 4h formed therein are suitably formed by, for example, vacuum coating such as CVD, vapor deposition, sputtering, etc.

The sealing film 32 is made of an inorganic film of, for example, silicon nitride, silicon oxide, silicon oxynitride, or aluminum oxide.

The sealing substrate 33 is, for example, a metal plate, a glass substrate, or a plastic substrate provided with a base coat film having the same configuration as the base coat film 6.

The sealing resin 34 is made of, for example, an ultraviolet-curable epoxy resin.

An inert gas such as argon or an organic resin is filled in a space surrounded by the sealing film 32, the sealing substrate 33, and the sealing resin 34. Here, the organic resin may contain a desiccating agent or an oxygen absorbent. In the space surrounded by the sealing film 32, the sealing substrate 33, and the sealing resin 34, a sheet material containing a desiccating agent or an oxygen absorbent may be attached, or a solution containing a desiccating agent or an oxygen absorbent may be applied. The sealing film 32 of the organic EL display 50b may be omitted, as long as the barrier characteristics of the sealing substrate 33 and the sealing resin 34 can be satisfactorily ensured.

Next, a method of manufacturing the organic EL display 50b of the present embodiment will be described. The method of manufacturing the organic EL display 50b of the present embodiment includes a base coat film formation step, an EL element formation step, and a sealing step.

<Base Coat Film Formation Step (Barrier Film Formation Step)>

A thin film of silicon nitride, silicon oxide, silicon oxynitride, aluminum oxide, or the like is formed to have a thickness of about 100 nm on a surface of a base substrate 10b such as a plastic substrate by vapor deposition, thereby forming a first inorganic film 1.

Subsequently, a thin film of polyacrylate, polyurea, parylene, polyimide, polyamide, or the like is formed to have a thickness of about 3 μm on a surface of the first inorganic film 1 by, for example, vapor deposition using a vapor deposition mask, thereby forming a first organic film 2 having first through holes 2h formed therein.

Then, a thin film of silicon nitride, silicon oxide, silicon oxynitride, aluminum oxide, or the like is formed to have a thickness of about 100 nm on a surface of the first organic film 2 by, for example, vapor deposition, thereby forming a second inorganic film 3.

Further, a thin film of polyacrylate, polyurea, parylene, polyimide, polyamide, or the like is formed to have a thickness of about 3 μm on a surface of the second inorganic film 3 by, for example, vapor deposition using a vapor deposition mask, thereby forming a second organic film 4 having second through holes 4h formed therein.

Finally, a thin film of silicon nitride, silicon oxide, silicon oxynitride, aluminum oxide, or the like is formed to have a thickness of about 100 nm on a surface of the second organic film 4 by, for example, vapor deposition, thereby forming a third inorganic film 5. In this way, a base coat film 6 covering the surface of the base substrate 10b is formed.

<EL Element Formation Step>

On a surface of the base coat film 6 formed at the base coat film formation step, gate lines 11, source lines 12a, power supply lines 12b, first TFTs 13a, second TFTs 13b, capacitors 13c, an interlayer insulating film 14, first electrodes 15, an edge cover 16, hole injection and transport layers 17, light-emitting layers 18, an electron transport and injection layer 19, a second electrode 20, etc. are formed by a known method, thereby forming an organic EL element 25.

<Sealing Step>

First, on a surface of the organic EL element 25 (the second electrode 20) formed at the EL element formation step, a thin film of silicon nitride, silicon oxide, silicon oxynitride, aluminum oxide, or the like is formed by, for example, vapor deposition to have a thickness of about 100 nm, thereby forming a sealing film 32.

Subsequently, a sealing resin 34 is applied to an edge of the sealing film 32 in a frame shape.

Further, the substrate (base substrate 10b) provided with the sealing film 32 and the sealing resin 34 is bonded to a sealing substrate 33 under an inert gas atmosphere, and then, the sealing resin 34 is hardened.

In the manner described above, the organic EL display 50b of the present embodiment can be manufactured.

As described above, according to the organic EL display 50b of the present embodiment and the method of manufacturing the same, the base coat film 6 for reducing degradation of the organic EL element 25 formed on the base substrate 10b at the EL element formation step is formed at the base coat film formation step by sequentially forming the first inorganic film 1, the first organic film 2 having the plurality of first through holes 2h formed in a thickness direction thereof, the second inorganic film 3, the second organic film 4 having the plurality of second through holes 4h formed in a thickness direction thereof, and the third inorganic film 5. Thus, each of the first organic film 2 and the second organic film 4 is a continuous film. Therefore, stress caused at interfaces between the first inorganic film 1, the first organic film 2, the second inorganic film 3, the second organic film 4, and the third inorganic film 5 of the multilayer film can be distributed and relieved by each of the entire first organic film 2 and the entire second organic film 4. Delamination at the interfaces between the first inorganic film 1, the first organic film 2, the second inorganic film 3, the second organic film 4, and the third inorganic film 5 of the multilayer film can be reduced. Therefore, it is possible to reduce delamination at the interface between an inorganic film and an organic film included in the base coat film 6 due to stress caused at the interface between the inorganic film and the organic film.

In the present embodiment, the organic EL display 50b including a plastic substrate as the base substrate 10b and the method of manufacturing the same have been described. However, the base coat film 6 (barrier film) is also useful in the case where a glass substrate is used as the base substrate 10b. That is, since the glass substrate has a very low permeability of oxygen and moisture, the glass substrate does not need a barrier film for reducing permeation of oxygen and moisture. However, when a thin glass substrate having, for example, a thickness of about 50 μm is used to provide flexibility for the organic EL display, bending stress may cause delamination of the organic EL element (25) from the base substrate (10b). If in such a case, a barrier film is formed as a base coat film on the glass substrate, the bending stress can be distributed and relieved by each of the entire first organic film (2) and the entire second organic film (4). As a result, it is possible to reduce delamination of the organic EL element (25) from the base substrate (10b) in bending the organic EL display.

<<Third Embodiment of Invention>>

Figure 13:
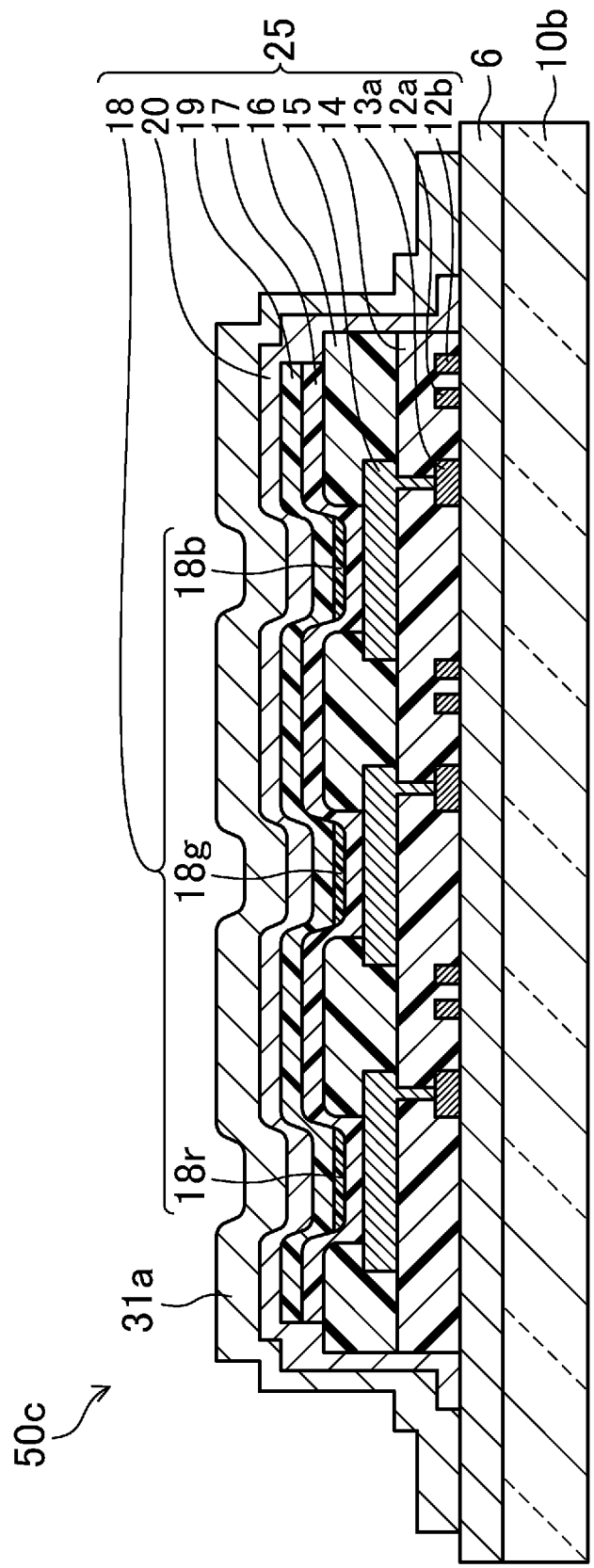
FIG. 13 is a cross-sectional view illustrating an organic EL display according to a third embodiment.

FIG. 13 is a cross-sectional view illustrating an organic EL display 50c of the present embodiment.

In the first embodiment, the organic EL display 50a including the sealing film 31a (31b) as a barrier film has been described. In the second embodiment, the organic EL display 50b including the base coat film 6 as a barrier film has been described. In the present embodiment, the organic EL display 50c including a base coat film 6 and a sealing film 31a as barrier films will be described.

As illustrated in FIG. 13, the organic EL display 50c includes a base substrate 10b such as a plastic substrate, the base coat film 6 as a barrier film provided on the base substrate 10b to reduce degradation of an organic EL element 25, the organic EL element 25 on the base coat film 6, and the sealing film 31a as a barrier film covering the organic EL element 25 to reduce degradation of the organic EL element 25.

The organic EL display 50c of the present embodiment can be manufactured by performing the sealing film formation step described in the first embodiment after sequentially performing the base coat film formation step and the EL element formation step described in the second embodiment.

According to the organic EL display 50c of the present embodiment and a method of manufacturing the same, the base coat film 6 for reducing degradation of the organic EL element 25 formed on the base substrate 10b at the EL element formation step is formed at the base coat film formation step by sequentially forming a first inorganic film 1, a first organic film 2 having a plurality of first through holes 2h formed in a thickness direction thereof, a second inorganic film 3, a second organic film 4 having a plurality of second through holes 4h formed in a thickness direction thereof, and a third inorganic film 5. Thus, each of the first organic film 2 and the second organic film 4 is a continuous film. Therefore, stress caused at interfaces between the first inorganic film 1, the first organic film 2, the second inorganic film 3, the second organic film 4, and the third inorganic film 5 of the multilayer film can be distributed and relieved by each of the entire first organic film 2 and the entire second organic film 4. Delamination at the interfaces between the first inorganic film 1, the first organic film 2, the second inorganic film 3, the second organic film 4, and the third inorganic film 5 of the multilayer film can be reduced. The sealing film 31a for reducing degradation of the organic EL element 25 formed on the base substrate 10b at the EL element formation step is formed at the sealing film formation step by sequentially forming a first inorganic film 26, a first organic film 27 having a plurality of first through holes 27h formed in a thickness direction thereof, a second inorganic film 28, a second organic film 29 having a plurality of second through holes 29h formed in a thickness direction thereof, and a third inorganic film 30. Thus, each of the first organic film 27 and the second organic film 29 is a continuous film. Therefore, stress caused at interfaces between the first inorganic film 26, the first organic film 27, the second inorganic film 28, the second organic film 29, and the third inorganic film 30 of the multilayer film can be distributed and relieved by each of the entire first organic film 27 and the entire second organic film 29. Delamination at the interfaces between the first inorganic film 26, the first organic film 27, the second inorganic film 28, the second organic film 29, and the third inorganic film 30 of the multilayer film can be reduced. Therefore, it is possible to reduce delamination at the interface between an inorganic film and an organic film respectively included in the base coat film 6 and the sealing film 31a due to stress caused at the interface between the inorganic film and the organic film.

<<Fourth Embodiment of Invention>>

FIG. 14 is a cross-sectional view of an organic EL display 50d of the present embodiment.

In the embodiments, the organic EL displays 50a-50c in each of which at least one of the sealing film 31a (31b) or the base coat film 6 is provided as a barrier film have been described. In the present embodiment, the organic EL display 50d including a base coat film 6a, a protection film 6b and a sealing film 31a as barrier films will be described.

As illustrated in FIG. 14, the organic EL display 50d includes a base substrate 10b such as a plastic substrate, the base coat film 6a as a barrier film provided on the base substrate 10b to reduce degradation of an organic EL element 25, the organic EL element 25 on the base coat film 6a, the sealing film 31a as a barrier film covering the organic EL element 25 to reduce degradation of the organic EL element 25, and the protection film 6b as a barrier film provided on a back face (a surface opposite to the organic EL element 25) of the base substrate 10b to reduce degradation of the organic EL element 25.

Each of the base coat film 6a and the protection film 6b has a configuration substantially the same as the configuration of the base coat film 6 described in the second embodiment.

The organic EL display 50d of the present embodiment can be manufactured by performing the base coat film formation step described in the second embodiment on a surface and the back face of the base substrate 10b, and then by performing the EL element formation step followed by the sealing film formation step described in the first embodiment.

According to the organic EL display 50d of the present embodiment and the method of manufacturing the same, each of the base coat film 6a and the protection film 6b for reducing degradation of the organic EL element 25 formed on the base substrate 10b at the EL element formation step is formed at the base coat film formation step by sequentially forming a first inorganic film 1, a first organic film 2 having a plurality of first through holes 2h formed in a thickness direction thereof, a second inorganic film 3, a second organic film 4 having a plurality of second through holes 4h formed in a thickness direction thereof, and a third inorganic film 5. Thus, each of the first organic film 2 and the second organic film 4 is a continuous film. Therefore, stress caused at interfaces between the first inorganic film 1, the first organic film 2, the second inorganic film 3, the second organic film 4, and the third inorganic film 5 of the multilayer film can be distributed and relieved by each of the entire first organic film 2 and the entire second organic film 4. Delamination at the interfaces between the first inorganic film 1, the first organic film 2, the second inorganic film 3, the second organic film 4, and the third inorganic film 5 of the multilayer film can be reduced. The sealing film 31*a* for reducing degradation of the organic EL element 25 formed on the base substrate 10*b* at the EL element formation step is formed at the sealing film formation step by sequentially forming a first inorganic film 26, a first organic film 27 having a plurality of first through holes 27*h* formed in a thickness direction thereof, a second inorganic film 28, a second organic film 29 having a plurality of second through holes 29*h* formed in a thickness direction thereof, and a third inorganic film 30. Thus, each of the first organic film 27 and the second organic film 29 is a continuous film. Therefore, stress caused at interfaces between the first inorganic film 26, the first organic film 27, the second inorganic film 28, the second organic film 29, and the third inorganic film 30 of the multilayer film can be distributed and relieved by each of the entire first organic film 27 and the entire second organic film 29. Delamination at the interfaces between the first inorganic film 26, the first organic film 27, the second inorganic film 28, the second organic film 29, and the third inorganic film 30 of the multilayer film can be reduced. Therefore, it is possible to reduce delamination at the interface between an inorganic film and an organic film respectively included in the base coat film 6*a*, the protection film 6*b*, and the sealing film 31*a* due to stress caused at the interface between the inorganic film and the organic film.

According to the organic EL display 50*d* of the present embodiment and the method of manufacturing the same, the protection film 6*b* is formed on the back face of the base substrate 10*b*. Therefore, the amounts of oxygen and moisture permeating through the base substrate 10*b* can be further reduced, which can further reduce degradation of the organic EL element 25.

In the above embodiments, the organic EL display including a barrier film in which each of the inorganic film and the organic film is made of a single-layer film has been described. However, the present invention is applicable to organic EL displays including a barrier film in which each of an inorganic film and an organic film is made of a multilayer film.

Although in the above embodiments, the organic EL display of a tri-color light-emitting method (tri-color pattern method) has been described, the present invention is applicable to organic EL displays of other methods including a color filter method (white color method), and a color changing method.

Although in each of the embodiments, the organic EL display of an active matrix drive type has been described, the present invention is also applicable to organic EL displays of a passive matrix drive type.

INDUSTRIAL APPLICABILITY

As described above, the present invention can reduce delamination at the interface between an inorganic film and an organic film of the barrier film, where the delamination is caused due to stress at the interface between the inorganic film and the organic film. Therefore, the present invention is useful for flexible organic EL displays requiring, for example, high stress resistance.

DESCRIPTION OF REFERENCE CHARACTERS

1, 26 First Inorganic Film
2, 27 First Organic Film
2*h*, 27*h* First Through Hole
3, 28 Second Inorganic Film
4, 29 Second Organic Film
4*h*, 29*h* Second Through Hole
5, 30 Third Inorganic Film
6, 6*a* Base Coat Film (Barrier Film)
6*b* Protection Film (Barrier Film)
10*a*, 10*b* Base Substrate
20 Organic EL Element
31*a*, 31*b* Sealing Film (Barrier Film)
50*a*-50*d* Organic EL Display

The invention claimed is:

1. An organic electroluminescence display comprising:
a base substrate;
an organic electroluminescence element on the base substrate;
a barrier film configured to reduce degradation of the organic electroluminescence element, wherein
the barrier film includes a first inorganic film, a second inorganic film, and a third inorganic film in order from the base substrate, a first organic film between the first inorganic film and the second inorganic film, and a second organic film between the second inorganic film and the third inorganic film,
the first organic film has a plurality of first through holes formed therein such that the first inorganic film is in contact with the second inorganic film through the first through holes,
the second organic film has a plurality of second through holes formed therein such that the second inorganic film is in contact with the third inorganic film through the second through holes,
the plurality of first through holes are provided apart from one another,
the plurality of second through holes are provided apart from one another, and
the entire first through holes and the entire second through holes do not overlap each other.

2. The organic electroluminescence display of claim 1, wherein each of the first through holes and the second through holes has a linear shape.

3. The organic electroluminescence display of claim 1, wherein each of the first through holes and the second through holes is dot-shaped.

4. The organic electroluminescence display of claim 1, wherein the barrier film is a sealing film covering the organic electroluminescence element.

5. The organic electroluminescence display of claim 1, wherein
the barrier film is a base coat film on a surface of the base substrate facing the organic electroluminescence element.

6. The organic electroluminescence display of claim 1, wherein
the barrier film is a protection film on a surface of the base substrate opposite to the organic electroluminescence element.

7. An organic electroluminescence display comprising:
a base substrate;
an organic electroluminescence element on the base substrate; and
a barrier film configured to reduce degradation of the organic electroluminescence element, wherein
the barrier film includes first to nth inorganic films in order from the base substrate, where n is a natural number greater than or equal to 3, and first to (n−1)th organic films each provided between adjacent ones of the inorganic films in order from the base substrate, each of the first to (n−1)th organic films has a plurality of through holes formed therein such that the inorganic films adjacent to the organic film are in contact with each other through the through holes, a part, in which the plurality of through holes are not formed, of at least one of the first to (n−1)th organic films substantially fully overlaps the through holes formed in at least one of the organic films other than the at least one organic film when viewed in plan, and in each of the first to (n−1)th organic films, the plurality of though holes are provided apart from one another.

8. A method of manufacturing an organic electroluminescence display, the method comprising:

an EL element formation step of forming an organic electroluminescence element on a base substrate; and a barrier film formation step of forming a barrier film configured to reduce degradation of the organic electroluminescence element, wherein at the barrier film formation step, a first inorganic film, a first organic film having a plurality of first through holes formed in a thickness direction thereof, a second inorganic film, a second organic film having a plurality of second through holes formed in a thickness direction thereof, and a third inorganic film are sequentially formed, the plurality of first through holes are provided apart from one another, the plurality of second through holOes are provided apart from one another, and at the barrier film formation step, the first organic film and the second organic film are formed such that the entire first through holes and the entire second through holes do not overlap each other.

9. The method of claim 8, wherein at the barrier film formation step, the first organic film and the second organic film are formed by vacuum coating.

10. The method of claim 8, wherein at the barrier film formation step, the first organic film and the second organic film are formed by a printing method or photolithography.

11. The method of claim 8, wherein the barrier film formation step is performed after the EL element formation step, and at the barrier film formation step, a sealing film covering the organic electroluminescence element is formed as the barrier film.

12. The method of claim 8, wherein the barrier film formation step is performed before the EL element formation step, and at the barrier film formation step, a base coat film covering a surface of the base substrate facing the organic electroluminescence element is formed as the barrier film.

13. The method of claim 8, wherein the barrier film formation step is performed before the EL element formation step, and at the barrier film formation step, a protection film covering a surface of the base substrate opposite to the organic electroluminescence element is formed as the barrier film.

14. The organic electroluminescence display of claim 1, wherein a hole of the first through holes is formed by a first closed space surrounded by the first organic film, and a hole of the second through holes is formed by a second closed space surrounded by the second organic film.

15. The organic electroluminescence display of claim 14, wherein an entirety of the first closed space overlaps with the second organic film, and an entirety of the second closed space overlaps with the first organic film.

* * * * *